(12) United States Patent
Liu

(10) Patent No.: US 8,506,706 B2
(45) Date of Patent: Aug. 13, 2013

(54) SYSTEMS, METHODS AND SUBSTRATES OF MONOCRYSTALLINE GERMANIUM CRYSTAL GROWTH

(75) Inventor: Weiguo Liu, San Leandro, CA (US)

(73) Assignee: AXT, Inc, Fremont, CA (US)

( * ) Notice: Subject to any disclaimer, the term of this patent is extended or adjusted under 35 U.S.C. 154(b) by 933 days.

(21) Appl. No.: 12/554,902

(22) Filed: Sep. 5, 2009

(65) Prior Publication Data

US 2010/0116196 A1    May 13, 2010

(30) Foreign Application Priority Data

Nov. 8, 2008  (CN) .......................... 2008 1 0177006

(51) Int. Cl.
 *C30B 21/02*  (2006.01)
(52) U.S. Cl.
 USPC .................. 117/81; 117/82; 117/83; 117/941
(58) Field of Classification Search
 USPC ........................ 117/81, 82, 83, 941
 See application file for complete search history.

(56) References Cited

U.S. PATENT DOCUMENTS

| | | | | |
|---|---|---|---|---|
| 4,203,951 | A | * | 5/1980 | Goriletsky et al. ........... 117/213 |
| 4,784,715 | A | * | 11/1988 | Stoll ................................ 117/28 |
| 6,866,714 | B2 | | 3/2005 | Kawase et al. |
| 7,179,331 | B2 | | 2/2007 | Muhe et al. |
| 2005/0087125 | A1 | | 4/2005 | Muhe et al. |

FOREIGN PATENT DOCUMENTS

EP   0927777 A1   7/1999

OTHER PUBLICATIONS

J. Vanhellemon, et al., "Brother Silicon, Sister Germanium", Journal of The Electrochemical Society, vol. 154(7), H572-H583, May 7, 2007.
International Search Report issued in corresponding PCT Application PCT/US2009/006052, Jun. 25, 2010, 3 pgs.
Documents from corresponding PCT Application PCT/US2009/006052, International Preliminary Report on Patentability, dated May 10, 2011, and Written Opinion, dated 25 Jun. 2010.

* cited by examiner

*Primary Examiner* — Bob M Kunemund
(74) *Attorney, Agent, or Firm* — Alston & Bird LLP

(57) ABSTRACT

Systems, methods, and substrates directed to growth of monocrystalline germanium (Ge) crystals are disclosed. In one exemplary implementation, there is provided a method for growing a monocrystalline germanium (Ge) crystal. Moreover, the method may include loading first raw Ge material into a crucible, loading second raw Ge material into a container for supplementing the Ge melt material, sealing the crucible and the container in an ampoule, placing the ampoule with the crucible into a crystal growth furnace, as well as melting the first and second raw Ge material and controlling the crystallizing temperature gradient of the melt to reproducibly provide monocrystalline germanium ingots with improved/desired characteristics.

21 Claims, 7 Drawing Sheets

SYSTEMS, METHODS AND SUBSTRATES OF MONOCRYSTALLINE GERMANIUM CRYSTAL GROWTH

CROSS-REFERENCE TO RELATED APPLICATION(S) INFORMATION

This application is based upon and claims benefit/priority from prior Chinese patent application No. 200810177006.0, filed Nov. 10, 2008, which is incorporated herein by reference in entirety.

BACKGROUND

1. Field

The present invention relates to the growth of monocrystalline germanium (Ge) crystals, as well as systems, methods and substrates related thereto.

2. Description of Related Information

Electronic and opto-electronic device manufacturers routinely require large and electronically uniform single semiconductor crystals which, when sliced and polished, provide substrates for microelectronic device production. The growth of a semiconductor crystal involves heating polycrystalline raw material to its melting point (typically in excess of 1,200° C.) to create a polycrystalline raw material melt, bringing the melt into contact with a high quality seed crystal of the same material, and allowing the melt to crystallize on its contact surface with the seed crystal. A number of different processes for accomplishing this are known from the literature. These include the Czochralski process (Cz) and its variant, the Liquid Encapsulated Czochralski process (LEC), the Horizontal Bridgman and Bridgman-Stockbarger processes (HB) and their vertical variants (VB), and the gradient freeze process (GF) and its variant, the vertical gradient freeze processes (VGF). See for example "Bulk Crystal Growth of Electronic, Optical and Optoelectronic Materials", P. Clapper, Ed., John Wiley and Sons Ltd, Chichester, England, 2005 for general discussions of these techniques and their application to the growth of various materials.

With regard to known processes, 150 mm (6 inch) diameter, low dislocation germanium single crystals have been produced commercially by using the Czochralski technique. Larger diameter wafer have been discussed, though not demonstrated (Vanhellemont and Simoen, J. Electrochemical Society, 154 (7) H572-H583 (2007). Further, 100 mm (4 inch) diameter germanium single crystals have been grown by the VGF and VB techniques as indicated in the literature (Ch. Frank-Rotsch, et al., J. Crystal Growth (2008), doi:10.1016, J. Crys Growth 2007.12.020).

As shown by many studies reported in the literature, compared with the Cz/LEC techniques, the VB/VGF growth techniques generally utilize lower thermal gradients and lower growth rates and, thus, produce single crystals with much lower dislocation densities (see A. S. Jordan et al., J. Cryst. Growth 128 (1993) 444-450, 2), M. Jurisch et al., J. Cryst. Growth 275 (2005) 283-291, and S. Kawarabayashi, 6th Intl. Conf. on InP and Related Materials (1994), 227-230). Thus, in certain applications, the VB/VGF processes may be preferred for the growth of large diameter, low dislocation density (or dislocation-free) germanium.

In commercial single crystal growth operations, the objectives are to grow an ingot at the lowest possible cost, and cut wafers from an ingot at a high yield, namely cut as many wafers as possible from an ingot. Therefore, if one wishes to grow the longest possible ingot, with all the other constraints imposed by the process, a large crucible size is often desired.

Usually, the charge to be loaded into the crucible is generally made up of polycrystalline chunks of different shapes, and big voids between raw materials result with no material in them; thus, the loading co-efficient is low. Hence, when the charge is melted, the crucible is only partially filled with the melt. Considering the desired melt volume and the structure of the available crucible, supplementing the melt with additional material is an important step in the whole growing process, and is also a complicated step. Aspects, here, are especially relevant for certain materials, such as germanium, which is subject to special process restrictions owing to its lower thermal conductivity (0.58 W $cm^{-1\circ}$ $C.^{-1}$) and higher density (5.32 g $cm^{-3}$) as compared to Si (1.358 W $cm^{-1\circ}$ $C.^{-1}$ and 2.3332 g $cm^{-3}$, for thermal conductivity and density, respectively).

Melt replenishment in crystal growth is known in several rudimentary forms. In silicon growth systems, for example, wherein means for adding lump polycrystalline raw material to a Si melt exist for the growth of monocrystalline Si, as well as in systems wherein raw material is loaded into a crucible for Cz growth of single crystals. Techniques like these are possible because the Cz (or LEC) system is open and access to the crucible is relatively easy. However, with the VGF and VB techniques wherein the crucible is contained in a sealed ampoule, such processes cannot be used. Moreover, special requirements associated with growing particular, doped germanium single crystal may obviate the ability to use such processes. For instance, if As, which has a high vapor pressure and is toxic, is used as a dopant, use of such processes involving doping germanium single crystal with As may be restricted.

SUMMARY

Systems, methods, and substrates consistent with the invention are directed to growth of monocrystalline germanium (Ge) crystals.

In one exemplary implementation, there is provided a method for growing a monocrystalline germanium (Ge) crystal. Moreover, the method may include loading first raw Ge material into a crucible, loading second raw Ge material into a container for supplementing the Ge melt material, sealing the crucible and the container in an ampoule, placing the ampoule with the crucible into a crystal growth furnace, as well as controlling melt of the first and second raw Ge material and controlling the crystallizing temperature gradient of the melt to reproducibly provide monocrystalline germanium ingots with desired crystal properties.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Aspects of the present innovations are particularly applicable to an apparatus and method for 150 mm (6") diameter Germanium ingot crystal growth and it is in this context that the apparatus and method are described. It should be appreciated, however, that aspects of the innovations have greater utility, for example, relevant apparatus and method can be used to produce Germanium (Ge) ingots of 50 mm (2") diameter and larger, such as ingots of 100 mm (4") and 200 mm (8") diameter.

Figure 1A:
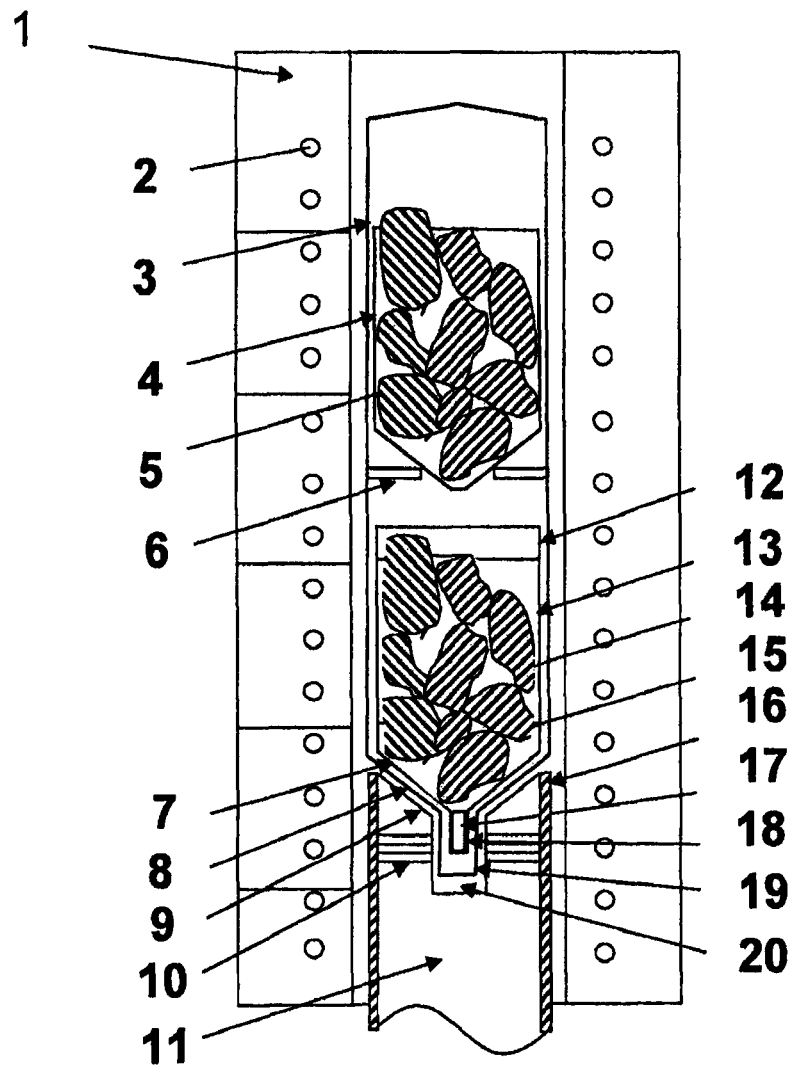
FIGS. 1A-1D are diagrams of longitudinal cross-sections of the apparatus for growing a monocrystalline germanium crystal, illustrating an exemplary crystal growth process consistent with certain aspects regarding the innovations herein.
Figure 1B:
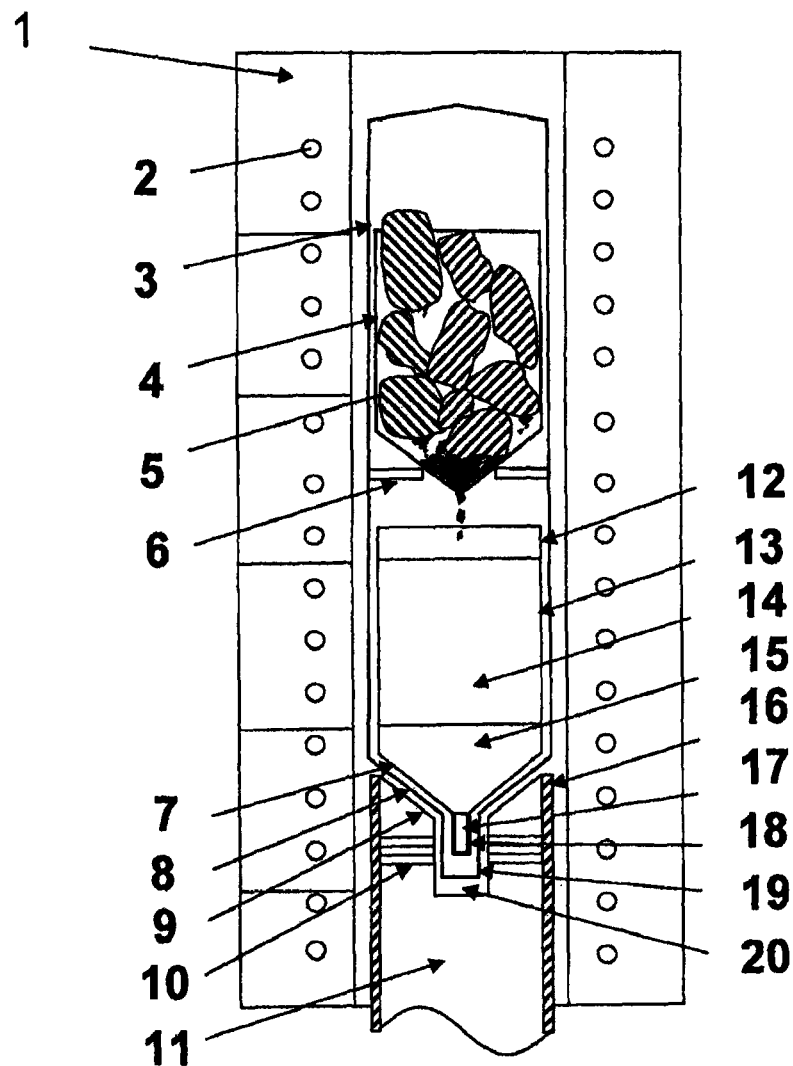
Figure 1C:
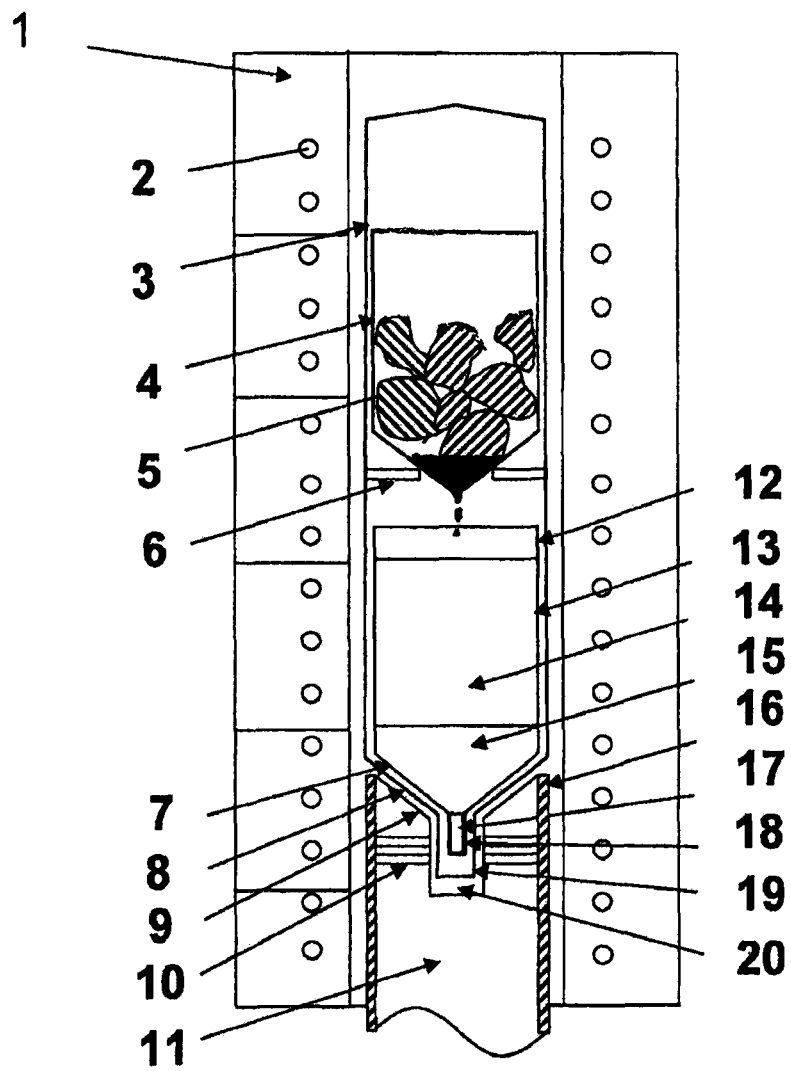
Figure 1D:
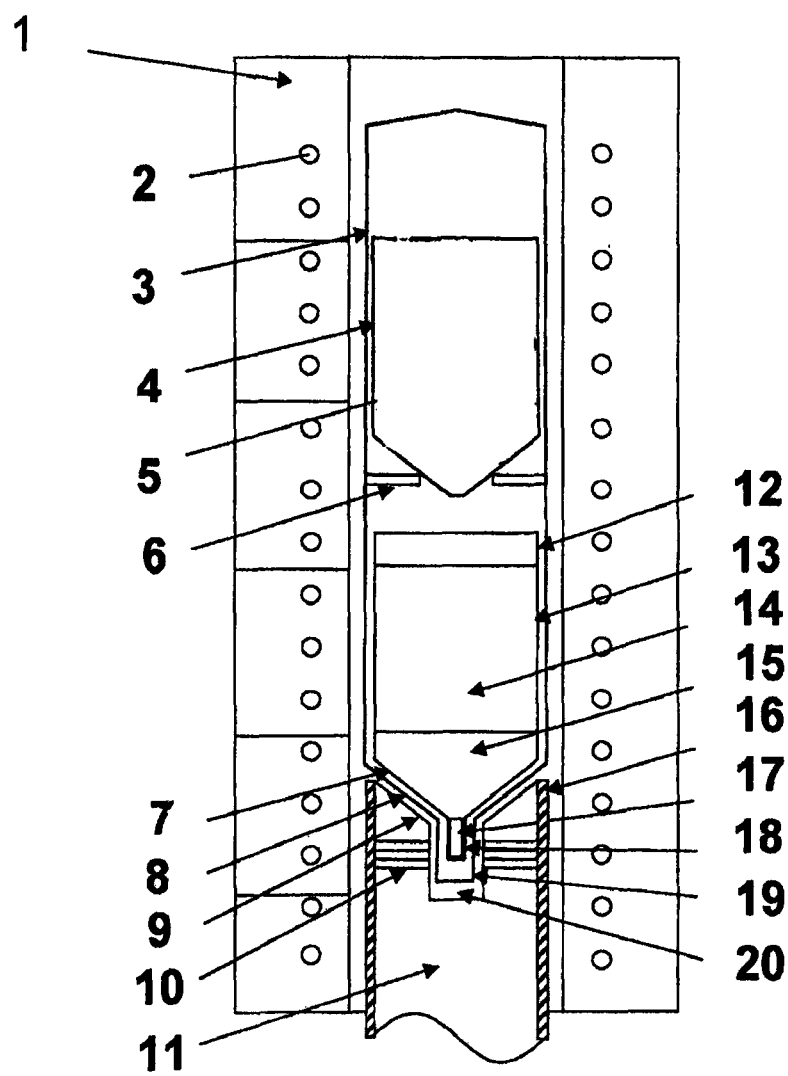
Figure 2:
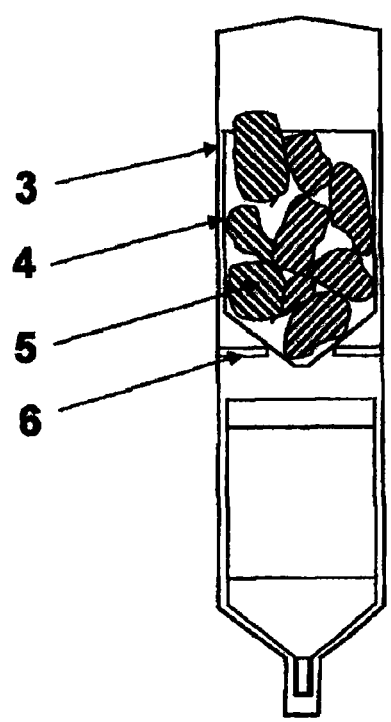
FIG. 2 is a diagram showing an exemplary state of carrying out crystal growth using a pBN container for raw material loading consistent with certain aspects regarding the innovations herein.

Consistent with FIGS. 1A-2, systems and methods for growing monocrystalline germanium (Ge) crystals are provided, wherein additional raw material melt may be added to the crucible (e.g., in a VGF and/or VB process, etc.) once the original raw material charge has been melted, but before crystal growth has started, thus allowing growth of longer, monocrystalline ingots. Moreover, the method may include loading first raw Ge material into a crucible that includes a seed well holding a seed crystal, loading second raw Ge material into a container for supplementing the Ge melt material, sealing the crucible and the container in an ampoule, and placing the ampoule with the crucible into a crystal growth furnace having a movable ampoule support that supports said ampoule. Further, exemplary implementations may include melting the first raw Ge material in the crucible to create a melt, melting the second raw Ge material in said container, and adding the melted second raw Ge material to said melt. Other exemplary implementations may include controlling the crystallizing temperature gradient of the melt so that the melt crystallizes when in contact with the seed crystal and forms a monocrystalline germanium ingot and, optionally, cooling the monocrystalline germanium ingot.

In one exemplary implementation, the step of forming the monocrystalline germanium ingot may include creating a temperature gradient of about 0.3 to about 2.5° C./cm in the crystal growth zone. Additionally, the monocrystalline germanium ingot may be cooled at a rate of about 0.2 to about 0.5° C./hr. Further, the crucible may be maintained stationary during movement of the crystallizing temperature gradient.

According to certain exemplary implementations, the monocrystalline germanium ingot may have a diameter of between about 50 mm to about 200 mm (about 2 inch to about 8 inch). In one implementation, for example, the monocrystalline germanium ingot may have a diameter of 152.4 mm (6 inch). Moreover, monocrystalline germanium ingots and wafers herein may have dislocation less than about 350/cm$^2$, less than about 300/cm$^2$, less than about 250/cm$^2$, or even less than about 200/cm$^2$.

Regarding systems consistent with the innovations herein, an exemplary apparatus for growing a large-diameter monocrystalline germanium crystal may comprise a crystal growth furnace including a heating source and a plurality of heating zones, an ampoule configured to be loaded into the furnace, wherein the ampoule includes a loading container and a crucible with a seed well, a movable ampoule support, and a controller coupled to the crystal growth furnace and the moveable ampoule support. Further, the controller may control one or more of the heating zones of the heating source and the movable ampoule support to perform a vertical gradient freeze process on the crucible when it is in the furnace.

According to certain implementations, the crystal growth furnace may have a plurality of heating zones, such as between 4 to 8 heating zones, between 5 to 7 heating zones, or 6 heating zones. Consistent with the ingot/wafer diameter desired, exemplary crucibles may have an inner diameter of between about 50 mm to about 200 mm (about 2 to about 8 inches), or, in some implementations, of about 150 mm (about 6 inches).

Turning to the drawings, FIGS. 1A-1D are diagrams of longitudinal cross-sections of the apparatus for growing a monocrystalline germanium crystal, illustrating an exemplary crystal growth process consistent with certain aspects related to the invention. FIG. 1A illustrates a cross sectional view of an example of a crystal growth apparatus. The apparatus may include a furnace for use in a vertical gradient freeze (VGF) growing process, or a vertical Bridgeman (VB) growing process, and may include an ampoule support 11 in a furnace 1, wherein the heater 2 is made up of multiple zones, each controlled individually by a computer controlled control system. The temperature of each zone is adjusted to give the desired overall temperature profile and the temperature gradient for controlled solidification of the melt. The temperature profile and the temperature gradient are adjusted such that the crystallization interface moves predictably up through the melt, for example, creating a temperature gradient of about 0.3 to about 2.5° C./cm in the crystal ingot growth zone. The ampoule support 11 provides physical support and thermal gradient control for an ampoule 3 (that, in one implementation, is made of quartz) which contains a crucible 12, which in turn is capable of holding a seed in a seed well 18. The ampoule support 11, when the furnace is in operation, can be moved axially during the crystal growth process. The crucible 12 may contain a seed crystal 17 from which is grown a monocrystal formed on top of the seed crystal. In one implementation, the crucible 12 may be a pyrolytic boron nitride (pBN) structure with a cylindrical crystal growth portion 13, a smaller diameter seed well cylinder 18 and a tapered transition portion 7. The crystal growth portion 13 is open at the top of the crucible 12 and has a diameter equal to the desired diameter of the crystal product. The current industry standard crystal diameters are 50.8, 76.2, 101.6 and 152.4 mm (2, 3, 4 and 6 inch) diameter ingots that can be cut into wafers. In an illustrative implementation, at the bottom of the crucible 12, the seed well cylinder 18 may have a closed bottom and a diameter slightly larger than that of a high quality seed crystal 17, e.g., about 6-25 mm, and a length on the order of 30-100 mm. The cylindrical crystal growth portion 13 and the seed well cylinder 18 may have straight walls or may taper outwardly on the order of one to a few degrees to facilitate the removal of the crystal from the crucible 12. The tapered transition portion 7 between the growth portion 13 and the seed well cylinder 18 has an angled side wall pitched at, for example approximately 45-60 degrees, with a larger diameter equal to and connected to the growth zone wall and a narrower diameter equal to and connected to the seed well wall. The angled side wall may also be at other angles that are steeper or less steep than 45-60 degrees.

In certain exemplary implementations, the ampoule 3 may be made of quartz. The ampoule 3 may have a shape similar to that of the crucible 12. The ampoule 3 is cylindrical in a seed growth region 19, cylindrical with a narrower diameter in its seed well region 19 and has a tapered transition region 8 between the two regions. The crucible 12 fits inside the ampoule 3 with a narrow margin between them. A second, upper container 4, as a raw material container, is seated on a quartz support 6. The quartz support 6 is sealed in the middle part of the ampoule 3. In one implementation of the invention, this second container 4 is made of pBN. It is this second container 4 into which most of the raw material 5 is filled. During the heating process, the raw material is melted and dropped down into the main crucible 12 from the bottom hole of the second container 4. The ampoule 3 is closed at the bottom of its seed well region 19 and sealed on top after the crucible and raw materials are loaded.

In implementations where the ampoule-crucible combination has a funnel shape, the ampoule support 11 is required to accommodate this funnel shape and hold the ampoule 12 stable and upright inside the furnace 1. In other implementations, the ampoule-crucible combination may be in a different shape, and the basic structure of the ampoule support 11 would be changed accordingly to fit the different shape. According to an implementation, the stability of, and the supporting strength provided to the ampoule and its contents are provided through a solid, thin-walled cylinder 16 of the ampoule support 11. The solid, thin-walled cylinder 16 accommodates the funnel end of the ampoule structure 3. In one implementation, the crucible support cylinder 16 is made of a heat conducting material, preferably quartz. In other implementations, silicon carbide or ceramic may also be utilized to form the crucible support cylinder 16. The cylinder 16 makes a circle of contact with ampoule 3, where the upper rim of the cylinder 16 meets the shoulder of the ampoule's tapered region 8. Such configuration leads to minimal solid-to-solid contact, a contact which ensures that little or no undesirable, relatively uncontrollable heat conduction occurs. As a result, heating is able to be generated by other, more controllable processes.

In further implementations, a low density insulating material, such as ceramic fiber, may fill the majority of the inside of the support cylinder 11 with only a hollow axial core 20 in approximately the center of the insulating material left empty to receive the seed well 19 of the ampoule 3. In other implementations, the low-density insulating material may also comprise alumina fiber (1,800° C.), alumina-silica fiber (1,426° C.), and/or zirconia fiber (2,200° C.). The insulating material is carefully placed in the ampoule support 11. The weight of the ampoule 3, as it sits on top of the cylinder 16, pushes the insulating material down and forms the slanted insulating material edge 9. Filling the majority of the cylinder interior with a low-density insulator reduces the flow of air, which ensures that little or no undesirable, relatively uncontrollable convection flow will take place. Like conduction, convection is an uncontrollable heat transfer method that works to the detriment of the VGF and other crystal growth process.

The hollow core 20, with a diameter approximately equal to the ampoule seed well 19, extends downward to a small distance below the bottom of the ampoule seed well 19. In another implementation, the hollow core 20 extends through the crucible support from the bottom of the seed well to the bottom of the furnace apparatus 1. The hollow core 20 provides a cooling path from the center of the crystal. It contributes to cooling in the seed well and in the center of the growing crystal. With this construction, heat energy can escape down through the center of the solid crystal and seed, down through this hollow core 20 in the insulating material within the crystal support 11. Without the hollow core 20, the temperature of the center of the cooling ingot would naturally be higher than that of the crystal material nearer to the outer surface. In this case, the center of the ingot in any horizontal cross section would crystallize later after its perimeter had solidified. Crystals with uniform electrical properties cannot be made under these conditions. With the creation of a hollow core 20 included in the crystal support method, heat energy is conducted down through the bottom of the ampoule 3 and the hollow core 20 from where it radiates back out of radiation channels 10. It is important to reduce heat energy from the center of the growing crystal so that the isothermal layers are kept flat across the crystal diameter. Maintaining a flat crystal-melt interface allows the production of crystals with uniform electrical and physical properties.

The low-density insulating material within the cylinder 11 obstructs the flow of heat radiation from a set of furnace heat elements 2 to the ampoule 3 in the seed well region 19; thus, this method requires the creation of a plurality of horizontal radiation channels/openings/tunnels 10 through the insulation material. The radiation channels 10 penetrate the insulating material to provide heat radiation outlets to controllably transfer heat from the furnace heating elements 2 to the ampoule seed well 19. The number, shapes and diameters of the radiation channels 10 varies depending on specific conditions. The radiation channels may also be slanted, bent or wave-like. The radiation channels do not necessarily have to be continuous, as they may extend only partially through the insulating material. This helps minimize convection currents. In one implementation, the diameter of these channels is small, on the order of a pencil width, so that convection airflow is insignificant. According to other implementations of the invention, larger holes with cross-sectional area on the order of 6.4516 cm$^2$ (a square inch) or more can also be used. The radiation channels 10 through the insulating material also work in conjunction with the hollow core 20 in the center of the insulating material to radiate heat energy drawn from the center of the crystal, and cool the crystal with planar isothermal temperature gradient layers. The radiation channels 10 enable temperature control and directly relate to crystal growth yield.

In one exemplary implementation of the innovations herein, in the phase of monocrystalline germanium ingot growing, the furnace temperature may be decreased at a rate of about 0.2 to about 0.5° C./hour to allow the monocrystalline germanium ingot to grow.

The sequence of drawings from FIG. 1A through FIG. 1D illustrates an exemplary process of melting and supplying germanium. FIG. 1A illustrates an initial state, where the solid germanium is present in both the upper container 4 and the crucible 12. As innovative heating features and processes, an intermediate state of the germanium melt is next shown in FIG. 1B, which illustrates a state wherein the solid germanium has been melted to a liquid in the crucible 12.

The heating elements of the heating zones of the furnace are adjusted in association with the respective supply of power so that the upper container is provided with required heat energy. Specifically, the upper container may be heated such that the germanium in the upper container 3 begins melting, and the molten germanium flows into the crucible 12 via a hole at the bottom of container 3. In one exemplary implementation, the region of the furnace where the upper container is present is heated to the range of about 940 to about 955 degrees Celsius, or of about 945 degrees to about 950 degrees Celsius. This process continues until all of the germanium in the upper container 3 is melted and flows into the crucible 12.

The furnace 1 as shown in FIGS. 1A-1D is an example of a furnace that may be used for a Vertical Gradient Freeze (VGF) crystal growth process. Other furnaces and configurations, such as Vertical Bridgman, may also be used. In the VGF crystal growth process, the crystallizing temperature gradient within a fixed heat source is being moved electrically while the crystal is stationary.

To carry out vertical gradient freeze growth (VGF) (32), it is necessary to establish an appropriate temperature gradient profile in the furnace. The heating zones of the furnace are controlled separately and individually with regard to their respective power supplies via a computer that is programmed to heat and cool to fulfill the furnace crystallizing temperature and temperature gradient requirements. With regard to the growing of germanium ingots, for example, the furnace temperature fluctuation may be required to be within less than about ±0.1° C. During the preparation of the furnace, the raw germanium polycrystalline material is loaded into the ampoule 3 as described in more detail with reference to FIG. 2.

As shown in the figures, a pBN loading container 4 which has a hole in the tapered portion is seated on a support 6 which is made of quartz located above crucible 12 in the ampoule 3. The loading container 4 allows the crucible 12 to be loaded with more raw materials. In particular, the raw germanium material 5 is typically solid chunks or pieces and therefore cannot be tightly packed into the crucible 12 to be melted. Thus, the loading container is used to hold extra raw material that can be melted and then drain down into the crucible 12 which results in a larger germanium charge in the crucible 12 which in turn results in a larger length and diameter germanium crystal. For example, about 65% of the raw material may be initially loaded into the loading container 4 and 35% of the raw material is loaded directly into the crucible 12. As one non-limiting example, a 5.115 kg charge of raw material is loaded into the crucible 12 and a 9.885 kg charge is loaded into the loading container 4, resulting in a 15000 g (15 kg) charge that produces a 152.4 mm (6 inch) diameter germanium ingot.

In one example, the germanium may be doped with Arsenic (As). Here, for example a 9° Off-orientation <100> seed may be loaded into the crucible before the charge is loaded. The charge of raw material and an appropriate amount of dopant is loaded into the crucible and into the loading container which are placed into the quartz ampoule 3. The ampoule and contents are evacuated to a vacuum of about $2.00 \times 10^{-4}$ Pascal (about $1.5 \times 10^{-6}$ Torr), after which the ampoule is sealed and loaded into the furnace, as shown in FIG. 1. The furnace is started, and the ampoule and contents are heated so that the raw material in the crucible 12 melts. During the growth, the furnace is at a temperature of approximately 1000° C. since the melting point of germanium is approximately 940° C. The crystallization interface temperature gradient may be adjusted to be about 0.5 to about 10° C./cm according to the different position of the ingot. Further, the overall temperature profile may be adjusted to give a crystallization rate of about 1-2 mm/hr. After the solidification is completed, the furnace may be cooled down at about 20-40° C./hr. Ge ingots resulting from such exemplary processes herein may have the following characteristics: the germanium crystal produced using such processes may have less than about 300 dislocations/cm², or between 150/cm² to about 300/cm², or between about 180/cm² to about 270/cm², or between about 60/cm² to about 300/cm², or between about 80/cm² to about 280/cm², or between about 100/cm² to about 260/cm², or in other such numerical windows in ranges of 10%, 20% or 30% of the quantities measured or set forth herein.

In another example, the inventive apparatus is composed of a quartz ampoule into which both the pBN loading container and the crucible may be inserted, along with a support 6 to hold the pBN loading container. The dimensions of the crucible are a diameter of about 150 mm in the growing crystal section, a length of 160 mm in the growing crystal section, and a diameter of 7 mm in the seed crystal section. In one exemplary implementation, a <100> oriented Ge seed crystal was inserted in the seed well of the pBN crucible and 96 g of boron trioxide as the liquid sealant was put into the pBN crucible above the seed. Then, a total of 14,974 g of Ge polycrystalline material was loaded in pBN crucible and pBN container respectively and both pBN container and crucible were inserted in a quartz ampoule and the quartz ampoule under a reduced pressure of about $2.00 \times 10^{-4}$ Pascal ($1.5 \times 10^{-6}$ Torr) was sealed with a quartz cap. The sealed ampoule then was loaded in the furnace and placed on the ampoule support.

The above-described quartz ampoule was heated at the rate of approximately 270° C./hr. When temperature was at about 30° C. over the melting point of the crystallizing material, the heating was held until all polycrystalline materials melt.

Figure 5:
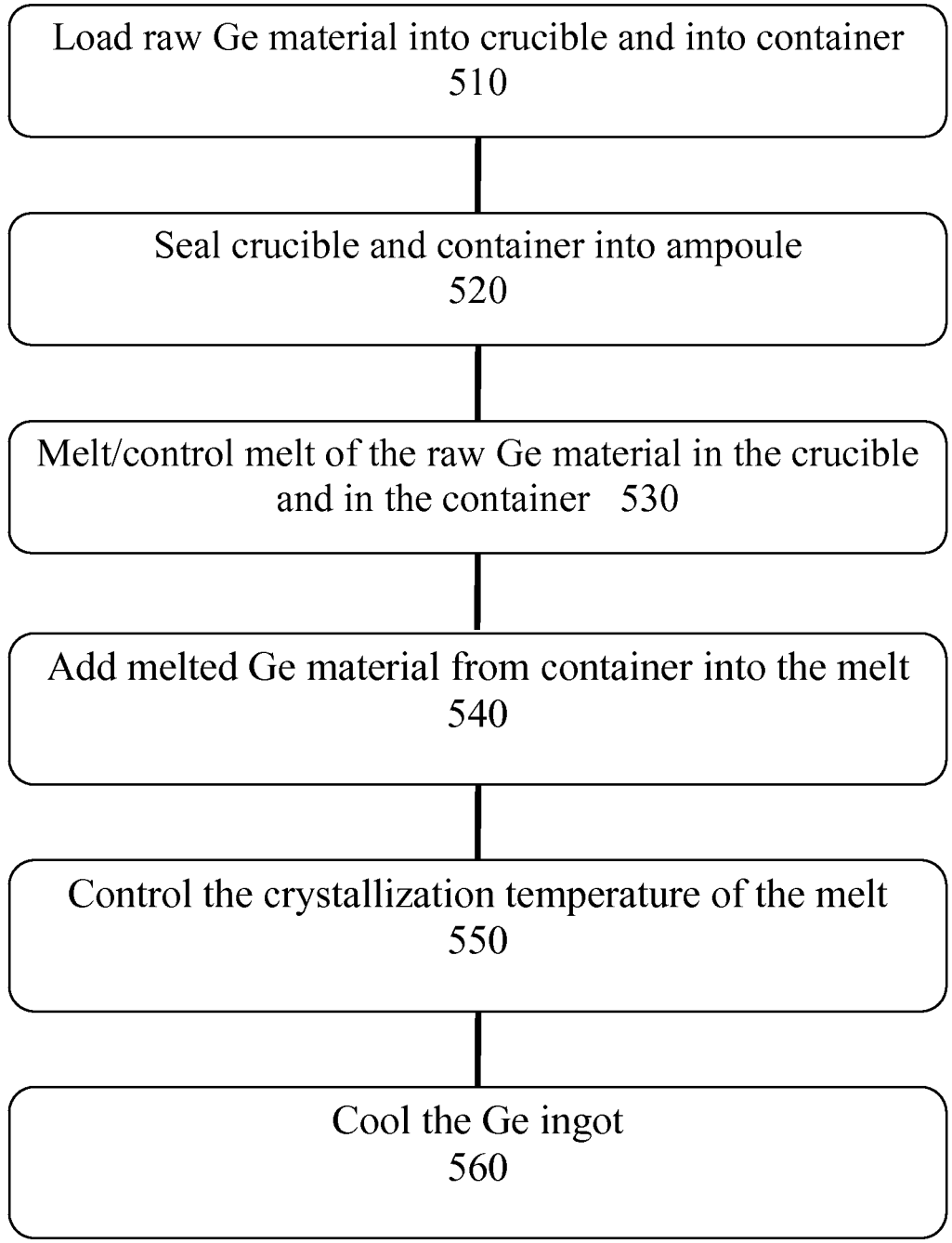
FIG. 5 is a flow diagram showing an exemplary process of crystal growth consistent with certain aspects regarding the innovations herein.

As set forth in FIG. 5, an exemplary method for growing a monocrystalline germanium (Ge) crystals consistent with the innovations herein is disclosed. In one exemplary implementation, there is provided a method for loading a first raw Ge material into a crucible, said crucible including a seed well holding a seed crystal, loading a second raw Ge material into a container for supplementing raw material, which is to be located within an ampoule, sealing the crucible and the container in said ampoule, placing said ampoule with said crucible and said container in it into a crystal growth furnace, controlling melt of the first raw Ge material in the crucible to create a melt, controlling melt of the second raw Ge material in said container. Further, such methods may include one or more of controlling addition of the melted second raw Ge material to said melt, controlling the crystallizing temperature gradient of the melt so that the melt crystallizes when in contact with the seed crystal and forms a monocrystalline germanium ingot, and cooling the monocrystalline germanium ingot.

Other exemplary implementations may include controlling melt of the second raw Ge material in said container including controlling heating applied to the second raw Ge material and maintaining the melted second raw Ge material within a temperature range. Further, controlling addition of the melted second raw Ge material to said melt may include maintaining said melt within a specified temperature range, and such range may be about 940 to about 955 degrees Celsius, or about 945 to about 950 degrees Celsius. Moreover, controlling addition of the melted second raw Ge material to said melt may include maintaining said melt within a specified temperature range, such as the ranges listed above.

In still other exemplary implementations, heating power and/or one or more cooling rates may be controlled or reduced in a controlled manner to yield Ge ingots having crystal properties within reproducibly provided ranges. Further, as a result of such process control, mono-crystalline germanium ingots having dislocation less than about $300/cm^2$, or in any of the other ranges set forth herein, may be reproducibly provided.

Further, by means of the processes set forth herein, germanium crystals having dislocation densities within the various ranges above may be reproducibly provided without use of external gas source supplied doping techniques. Aspects of these advantages, for example, may relate to the use of sealed ampoules (e.g., sealed under vacuum, at a pressure or other conditions, etc.) and avoid associated complexities such as the need for expensive gas supply hardware and control system/electronics, etc. In some instances, innovations herein may be advantageously associated with systems and methods that entail non-contact doping techniques. As such, germanium crystals having dislocation densities within the various ranges above may be reproducibly provided without use of contact doping techniques and/or external gas source supplied doping techniques.

In some implementations, VGF methods may be used to perform crystal growth. Further, the heater power may be reduced first in the lowest heating zone to start crystal growth at the seed, and then the heater power may be reduced in the transition region, wherein the cooling rate was at about 0.3 to about 0.4° C./hr. This cooling rate was maintained for approximately 70 hours. Once crystallization reached the main growth region, the heater power in the appropriate zone was reduced to give a cooling rate of about 0.4 to about 0.7° C./hr with a crystallization interface temperature gradient of about 1.2 to about 3.0° C./cm, both of which were maintained for approximately 120 hours. After completion of crystallization, the furnace was cooled at a rate of about 20 to about 40° C./hour until it reached room temperature.

Figure 3:
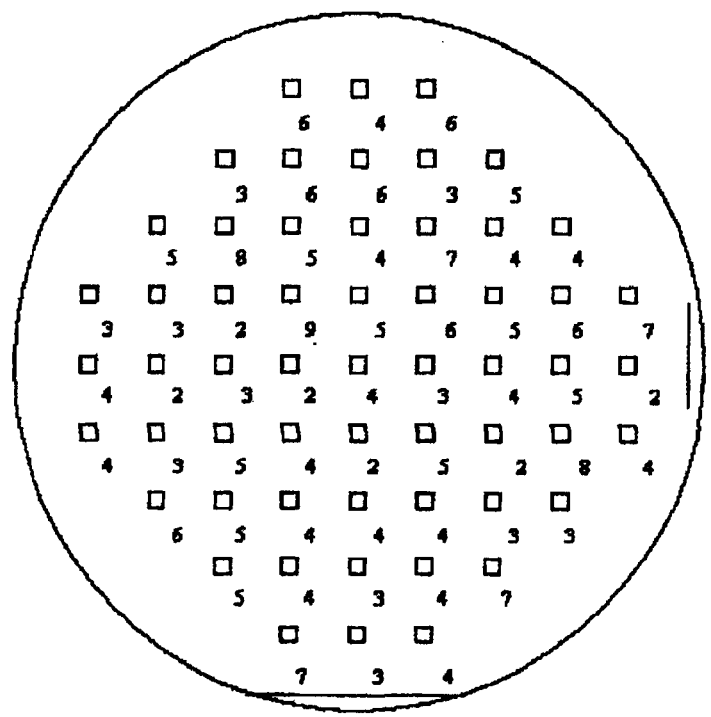
FIG. 3 is an example of EPD map of the head of germanium ingot with a diameter of 150 mm grown consistent with certain aspects consistent with certain aspects regarding the innovations herein (57 points EPD, average EPD: 186).
Figure 4:
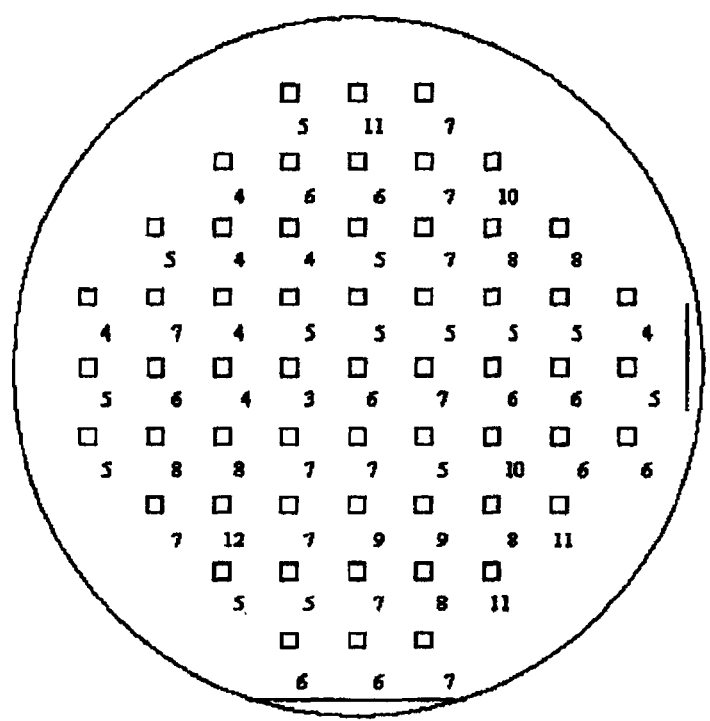
FIG. 4 is an example of EPD map of the tail of germanium ingot with a diameter of 150 mm grown consistent with certain aspects regarding the innovations herein (57 points EPD, average EPD: 270).

An exemplary, resulting crystal ingot had a 125 mm body length, and is completely single crystal. From the starting growth portion to the end of growth portion the crystal had a free carrier concentration of $9.05 \times 10^{17}$ to $4.86 \times 10^{18}/cm^3$ and a Resistivity of $7.29 \times 10^{-3}$ to $2.78 \times 10^{-3}$ $\Omega \cdot cm$ with a mobility of 955 $cm^2/Vs$ to 467 $cm^2/Vs$. The dislocation density is $186/cm^2$ at the starting portion as shown in FIG. 3 and $270/cm^2$ at the end of growth portion as shown in FIG. 4.

As such, it should be noted that any germanium crystal substrates (e.g., ingots, wafers, etc.) produced by the methods/processes of the present disclosure are specifically within ambit of the innovations herein. Further, any products (e.g., electronic or opto-electronic device, etc.) that include such germanium crystal substrates produced by any of the methods/processes herein are also consonant with the present innovations.

While the foregoing description has been made with reference to some particular implementations of the invention, it will be appreciated by those skilled in the art that changes in these implementations may be made without departing from the principles and spirit of the invention, the scope of which is defined by the appended claims.

The invention claimed is:

1. A method for growing a monocrystalline germanium (Ge) crystal, comprising:
    loading a first raw Ge material into a crucible, the crucible including a seed well holding a seed crystal;
    loading a second raw Ge material into a container for supplementing the first raw Ge material;
    sealing the crucible and the container in an ampoule;
    placing the ampoule in a crystal growth furnace having a movable ampoule support that supports the ampoule;
    melting the first raw Ge material in the crucible to create a melt;
    melting the second raw Ge material in the container;
    adding the second raw Ge material as melted to the melt;
    controlling a crystallizing temperature gradient of the melt so that the melt crystallizes when in contact with the seed crystal and forms a monocrystalline germanium ingot; and
    cooling the monocrystalline germanium ingot.

2. The method of claim 1, wherein forming the monocrystalline germanium ingot comprises creating a temperature gradient of 0.3 to 2.5° C./cm in the crystal growth zone.

3. The method of claim 1, wherein the monocrystalline germanium ingot is cooled at a rate of 0.2 to 0.5° C./hr.

4. The method of claim 1, further comprising maintaining the crucible stationary during movement of the crystallizing temperature gradient.

5. The method of claim 1, wherein the monocrystalline germanium ingot has a diameter of between about 50 mm (about 2 inches) and about 200 mm (about 8 inches).

6. The method of claim 5, wherein the monocrystalline germanium ingot has a diameter of about 150 mm (about 6 inches).

7. The method of claim 1, wherein the monocrystalline germanium ingot has dislocation less than about $300/cm^2$.

8. A method for growing a monocrystalline germanium (Ge) crystal, comprising:
    loading a first raw Ge material into a crucible, the crucible including a seed well holding a seed crystal;
    loading a second raw Ge material into a container for supplementing the first raw Ge material;
    sealing the crucible and the container in an ampoule;
    placing the ampoule in a crystal growth furnace;
    controlling melt of the first raw Ge material in the crucible to create a melt;
    controlling melt of the second raw Ge material in the container;
    adding the second raw Ge material as melted to the melt;
    controlling a crystallizing temperature gradient of the melt so that the melt crystallizes when in contact with the seed crystal and forms a monocrystalline germanium ingot; and
    cooling the monocrystalline germanium ingot.

9. The method of claim 8 wherein controlling melt of the second raw Ge material in the container includes controlling heating applied to the second raw Ge material and maintaining the melted second raw Ge material within a temperature range.

10. The method of claim 8 wherein controlling addition of the melted second raw Ge material to the melt includes maintaining the melt within a specified temperature range.

11. The method of claim 9 wherein the temperature range is about 940 to about 955 degrees Celsius.

12. The method of claim 9 wherein the temperature range is about 945 to about 950 degrees Celsius.

13. The method of claim 8 wherein controlling addition of the second raw Ge material as melted to the melt includes maintaining the melt within a specified temperature range.

14. The method of claim 13 wherein the specified temperature range is about 940 to about 955 degrees Celsius.

15. The method of claim 13 wherein the specified temperature range is about 945 to about 950 degrees Celsius.

16. The method of claim 8 wherein heating power and/or one or more cooling rates are controlled or reduced in a controlled manner to yield Ge ingots having crystal properties within reproducible ranges.

17. The method of claim 16 wherein, as a result of one or more of the controlling steps, monocrystalline germanium ingots having dislocation less than about 300/cm$^2$ are reproducibly provided.

18. The method of claim 17 wherein, as a result of the crystal fabrication process, germanium crystals having dislocation densities within a set range are reproducibly provided without use of external gas source supplied doping techniques.

19. The method of claim 18 wherein the set range of dislocation is less than about 300/cm$^2$.

20. The method of claim 19 further comprising heating the ampoule/crucible via between 5 and 7 heating zones.

21. The method of claim 20, wherein the ampoule/crucible is heated via six heating zones.

* * * * *